US007491989B2

(12) United States Patent
Loutfy et al.

(10) Patent No.: US 7,491,989 B2
(45) Date of Patent: Feb. 17, 2009

(54) POSITIVE CHARGING PHOTORECEPTOR

(75) Inventors: Rafik O. Loutfy, North York (CA); Zoran D. Popovic, Mississauga (CA); John F. Graham, Oakville (CA); Timothy P. Bender, Port Credit (CA)

(73) Assignee: Xerox Corporation, Norwalk, CT (US)

( * ) Notice: Subject to any disclaimer, the term of this patent is extended or adjusted under 35 U.S.C. 154(b) by 503 days.

(21) Appl. No.: 11/191,048

(22) Filed: Jul. 28, 2005

(65) Prior Publication Data

US 2007/0023747 A1 Feb. 1, 2007

(51) Int. Cl.
*H01L 31/062* (2006.01)

(52) U.S. Cl. ...................................... 257/290; 257/291

(58) Field of Classification Search ................. 257/290, 257/291
See application file for complete search history.

(56) References Cited

U.S. PATENT DOCUMENTS

| | | | | |
|---|---|---|---|---|
| 2,886,434 | A | 5/1959 | Owens | |
| 3,121,006 | A | 2/1964 | Middleton et al. | |
| 3,357,989 | A | 12/1967 | Byrne et al. | |
| 3,397,982 | A | 8/1968 | Lane | |
| 3,442,781 | A | 5/1969 | Weinberger | |
| 3,655,377 | A | 4/1972 | Sechak | |
| 4,081,274 | A | 3/1978 | Horgan | |
| 4,115,116 | A | 9/1978 | Stolka et al. | |
| 4,233,384 | A | 11/1980 | Turner et al. | |
| 4,265,990 | A | 5/1981 | Stolka et al. | |
| 4,299,897 | A | 11/1981 | Stolka et al. | |
| 4,304,829 | A | 12/1981 | Limburg et al. | |
| 4,306,008 | A | 12/1981 | Pai et al. | |
| 4,415,639 | A | 11/1983 | Horgan | |
| 4,420,547 | A | 12/1983 | Nishikawa | |
| 4,647,521 | A | 3/1987 | Oguchi et al. | |
| 4,664,995 | A | 5/1987 | Horgan et al. | |
| 4,675,262 | A | 6/1987 | Tanaka | |
| 4,678,731 | A | 7/1987 | Yoshizawa et al. | |
| 4,713,308 | A | 12/1987 | Yoshizawa et al. | |
| 4,717,637 | A | 1/1988 | Yoshizawa et al. | |
| 4,784,928 | A | 11/1988 | Kan et al. | |
| 4,855,203 | A | 8/1989 | Badesha et al. | |
| 4,869,982 | A | 9/1989 | Murphy | |
| 5,008,167 | A | 4/1991 | Yu | |
| 5,096,795 | A | 3/1992 | Yu | |
| 5,521,047 | A | 5/1996 | Yuh et al. | |
| 5,707,767 | A | 1/1998 | Yu | |
| 5,709,974 | A | 1/1998 | Yuh et al. | |
| 5,891,594 | A | 4/1999 | Yuh et al. | |
| 6,214,514 | B1 | 4/2001 | Evans et al. | |
| 6,410,196 | B1 * | 6/2002 | Carmichael et al. | 430/59.6 |

OTHER PUBLICATIONS

U.S. Appl. No. 10/938,887.
U.S. Appl. No. 10/992,658.
U.S. Appl. No. 10/992,687.
U.S. Appl. No. 10/992,690.
U.S. Appl. No. 10/998,585.
U.S. Appl. No. 11/034,062.
U.S. Appl. No. 11/034,713.

* cited by examiner

*Primary Examiner*—Long Pham
(74) *Attorney, Agent, or Firm*—Oliff & Berridge, PLC

(57) ABSTRACT

An imaging member includes a substrate, a charge transport layer, a charge generator layer, and a charge transporting or photoconductive overcoating layer.

18 Claims, 1 Drawing Sheet

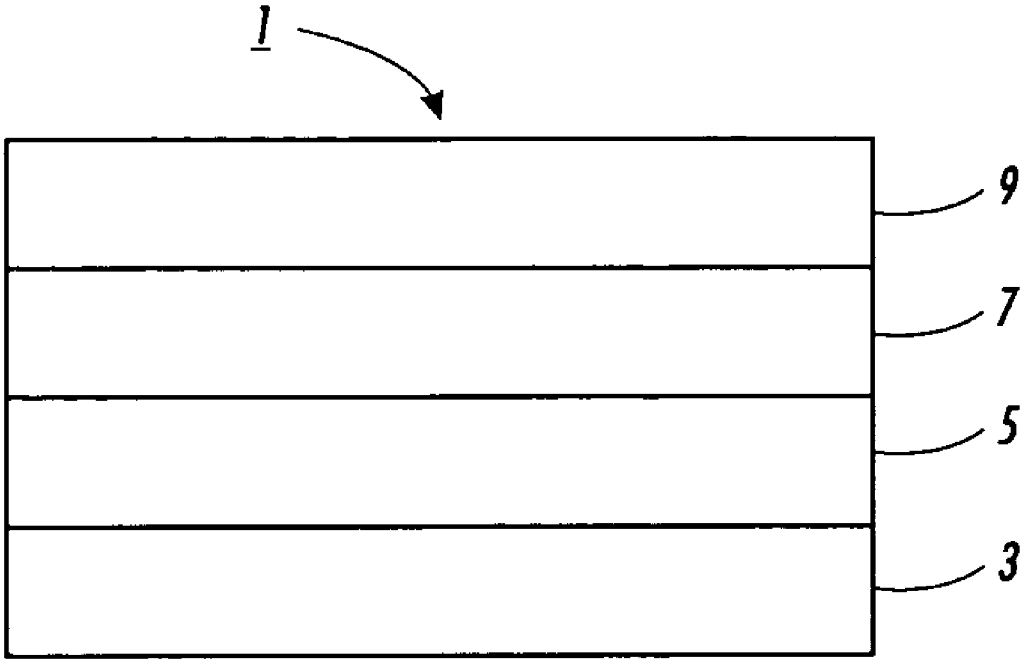
1
9
7
5
3

POSITIVE CHARGING PHOTORECEPTOR

BACKGROUND

The present disclosure relates to photoreceptors, and methods for making and using such photoreceptors, which photoreceptors are positively chargeable and provide a long useful life. More particularly, the disclosure relates to photoreceptors having, in order, at least a substrate layer, a charge transport layer, a charge generating layer, and a charge transporting or photoconductive overcoat layer.

In electrophotography, also known as Xerography, electrophotographic imaging or electrostatographic imaging, the surface of an electrophotographic plate, drum, belt or the like (imaging member or photoreceptor) containing a photoconductive insulating layer on a conductive layer is first uniformly electrostatically charged. The imaging member is then exposed to a pattern of activating electromagnetic radiation, such as light. The radiation selectively dissipates the charge on the illuminated areas of the photoconductive insulating layer while leaving behind an electrostatic latent image on the non-illuminated areas. This electrostatic latent image may then be developed to form a visible image by depositing finely divided electroscopic marking particles on the surface of the photoconductive insulating layer. The resulting visible image may then be transferred from the imaging member directly or indirectly (such as by a transfer or other member) to a print substrate, such as transparency or paper. The imaging process may be repeated many times with reusable imaging members.

An electrophotographic imaging member may be provided in a number of forms. For example, the imaging member may be a homogeneous layer of a single material such as vitreous selenium or it may be a composite layer containing a photoconductor and other materials. In addition, the imaging member may be layered in which each layer making up the member performs a certain function. Current layered organic imaging members generally have at least a substrate layer and two electro or photo active layers. These active layers generally include (1) a charge generating layer containing a light-absorbing material, and (2) a charge transport layer containing charge transport molecules or materials. These layers can be in a variety of orders to make up a functional device, and sometimes can be combined in a single or mixed layer. The substrate layer may be formed from a conductive material. Alternatively, a conductive layer can be formed on a nonconductive inert substrate by a technique such as but not limited to sputter coating.

The charge generating layer is capable of photogenerating charge and injecting the photogenerated charge into the charge transport layer or other layer. For example, U.S. Pat. No. 4,855,203 to Miyaka teaches charge generating layers comprising a resin dispersed pigment. Suitable pigments include photoconductive zinc oxide or cadmium sulfide and organic pigments such as phthalocyanine type pigment, a polycyclic quinone type pigment, a perylene pigment, an azo type pigment and a quinacridone type pigment. Imaging members with perylene charge generating pigments, particularly benzimidazole perylene, show superior performance with extended life.

In the charge transport layer, the charge transport molecules may be in a polymer binder. In this case, the charge transport molecules provide hole or electron transport properties, while the electrically inactive polymer binder provides mechanical properties. Alternatively, the charge transport layer can be made from a charge transporting polymer such a vinyl polymer, polysilylene or polyether carbonate, wherein the charge transport properties are chemically incorporated into the mechanically robust polymer.

Imaging members may also include a charge blocking layer(s) and/or an adhesive layer(s) between the charge generating layer and the transportive layer. In addition, imaging members may contain protective overcoatings. These protective overcoatings can be either electroactive or inactive, where electroactive overcoatings are generally preferred. Further, imaging members may include layers to provide special functions such as incoherent reflection of laser light, dot patterns and/or pictorial imaging or subbing layers to provide chemical sealing and/or a smooth coating surface.

Imaging members are generally exposed to repetitive electrophotographic cycling, which subjects the exposed charge transport layer or alternative top layer thereof to mechanical abrasion, chemical attack and heat. This repetitive cycling leads to a gradual deterioration in the mechanical and electrical characteristics of the exposed charge transport layer.

Although excellent toner images may be obtained with multilayered belt or drum photoreceptors, it has been found that as more advanced, higher speed electrophotographic copiers, duplicators and printers are developed, there is a greater demand on copy quality. A delicate balance in charging image and bias potentials, and characteristics of the toner and/or developer, must be maintained. This places additional constraints on the quality of photoreceptor manufacturing, and thus, on the manufacturing yield. In certain combinations of materials for photoreceptors, or in certain production batches of photoreceptor materials involved in the same kind of materials, localized microdefect sites (which may vary in size from about 50 to about 200 microns) can occur, using photoreceptors fabricated from these materials, where the dark decay is high compared to spatially uniform dark decay present in the sample. These sites appear as print defects (microdefects) in the final imaged copy. In charged area development, where the charged areas are printed as dark areas, the sites print out as white spots. Likewise, in discharged area development systems, where the exposed area (discharged area) is printed as dark areas, these sites print out as dark spots in a white background. All of these microdefects, which exhibit inordinately large dark decay, are called charge deficient spots. Such charge deficient spots can also occur in negatively charging photoreceptors, where a hole can be injected into the structure through the ground plane and carried up through the charge generating and charge transport layers.

Various protective coatings have been applied to both organic and inorganic photoreceptors. For example, U.S. Pat. No. 3,397,982 discloses an electrostatic imaging device comprising a photoconductive layer containing an inorganic glass material, and a photoconductive layer with an overcoating comprised of various oxides, such as germanium oxides, vanadium oxides, and silicon dioxides.

U.S. Pat. No. 3,655,377 discloses the use of an arsenic selenium alloy as an overcoating on a tellurium selenium alloy photogenerator layer. U.S. Pat. No. 4,420,547 discloses a layered photoreceptor having an ultraviolet light absorbing top layer.

Furthermore, there is disclosed in U.S. Pat. No. 2,886,434 processes for protecting selenium photoconductive substances with a thin, transparent film of a material having electrical characteristics comparable to selenium. Examples of materials disclosed as protective layers in this patent include zinc sulfide, silica, various silicates, alkaline earth fluorides, and the like.

U.S. Pat. Nos. 5,096,795 and 5,008,167 disclose electrophotographic imaging devices, where the exposed layer has particles, such as metal oxide particles, homogeneously dispersed therein. The particles provide coefficient of surface contact friction reduction, increased wear resistance, durability against tensile cracking, and improved adhesion of the layers without adversely affecting the optical and electrical properties of the imaging member.

U.S. Pat. No. 5,707,767 discloses an electrophotographic imaging member including a supporting substrate having an electrically conductive surface, a hole blocking layer, an optional adhesive layer, a charge generating layer, a charge transport layer, an optional anticurl back coating, a ground strip layer and an optional overcoating layer. At least one of the charge transport layer, anticurl back coating, ground strip layer and overcoating layer includes silica particle clusters homogeneously distributed in a film forming matrix.

U.S. Pat. No. 4,869,982 discloses an electrophotographic photoreceptor containing a toner release material in a charge transport layer. From about 0.5 to about 20 percent of a toner release agent selected from stearates, silicon oxides and fluorocarbons is incorporated into a charge transport layer.

U.S. Pat. No. 4,784,928 discloses an electrophotographic element having two charge transport layers. An outermost charge transport layer or overcoating may comprise a waxy spreadable solid, stearates, polyolefin waxes, and fluorocarbon polymers such as Vydax fluorotelomer from du Pont and Polymist F5A from Allied Chemical Company.

U.S. Pat. No. 4,664,995 discloses an electrostatographic imaging member utilizing a ground strip. The disclosed ground strip material comprises a film forming binder, conductive particles and microcrystalline silica particles dispersed in the film forming binder, and a reaction product of a bi-functional chemical coupling agent that interacts with both the film forming binder and the microcrystalline silica particles.

U.S. Pat. No. 4,717,637 discloses a microcrystalline silicon barrier layer.

U.S. Pat. Nos. 4,678,731 and 4,713,308 disclose microcrystalline silicon in the photoconductive and barrier layers of a photosensitive member.

U.S. Pat. No. 4,675,262 discloses a charge transport layer containing powders having a different refractive index than that of the charge transport layer excluding the powder material. The powder materials include various metal oxides.

U.S. Pat. No. 4,647,521 discloses the addition of amorphous hydrophobic silica powder to the top layer of a photosensitive member. The silica is of spherical shape and has a size distribution between 10 and 1000 Angstroms. Hydrophobic silica is a synthetic silica having surface silanol (SiOH) groups replaced by hydrophobic organic groups such as $—CH_3$.

SUMMARY

Nevertheless, there continues to be a need for photoreceptor designs that can avoid or eliminate the occurrence of charge deficient spots. There further remains a need for improved layered photoreceptors, which not only generated acceptable images but which can be repeatedly used in a number of imaging cycles without deterioration thereof from the machine environment or surrounding conditions. Further, there continues to be a need for improved photoreceptors that contain at least hole transport layers, photogenerating layers, and overcoat layers, which provide high quality images.

The present disclosure addresses these and other needs by providing a photoreceptor having improved operating and mechanical wear characteristics. These benefits are provided by a positively chargeable photoreceptor having, in order, at least a substrate layer, a charge transport layer, a charge generating layer, and a charge transporting or photoconductive overcoat layer.

In particular, the present disclosure provides an imaging member, such as a positive charging imaging member, comprising at least in order:

a substrate, a charge transport layer, a charge generating layer, and a charge transporting or photoconductive overcoating layer.

The present disclosure also provides a method for making such an imaging member, generally comprising:

providing an imaging member substrate, applying at least a charge transport layer and a generating layer over said substrate, and applying a charge transporting or photoconductive overcoating layer over said charge generating layer and said charge transport layer.

BRIEF DESCRIPTION OF THE DRAWINGS

These and other advantages and features of this disclosure will be apparent from the following, especially when considered with the accompanying drawings, in which:

The FIGURE is a partial schematic cross-sectional view of a photoreceptor.

DETAILED DESCRIPTION OF PREFERRED EMBODIMENTS

The present disclosure relates to imaging members having improved properties, and to methods of forming and using such imaging members.

According to embodiments of the present disclosure, an electrophotographic imaging member is provided, which generally comprises at least a substrate layer, a hole or charge transporting layer, a charge generating layer, and a charge transporting or photoconductive overcoat layer, preferably in that order. This imaging member can be employed in an imaging process comprising providing the electrophotographic imaging member, depositing a uniform electrostatic charge on the imaging member with a corona charging device, exposing the imaging member to activating radiation in image configuration to form an electrostatic latent image on the imaging member, developing the electrostatic latent image with electrostatically attractable toner particles to form a toner image, transferring the toner image to a receiving member and repeating the depositing, exposing, developing and transferring steps. These imaging members may be fabricated by any of the various known methods.

In general, electrostatographic imaging members are well known in the art. An electrostatographic imaging member, including the electrostatographic imaging member of the present disclosure, may be prepared by any of the various suitable techniques, provided that the described layers of the described materials are utilized, particularly with respect to the charge transporting or photoconductive overcoat layer. Suitable conventional photoreceptor designs that can be modified in accordance with the present disclosure include, but are not limited to, those described for example in U.S. Pat. Nos. 4,647,521, 4,664,995, 4,675,262, 4,678,731, 4,713,308, 4,717,637, 4,784,928, 4,869,982, 5,008,167, 5,096,795, and 5,707,767, the entire disclosures of which are incorporated herein by reference.

Illustrated in the FIGURE is a photoreceptor according to the disclosure, generally designated 1. The photoreceptor includes a substrate 3, a hole or charge transporting layer 5, a charge generating layer 7, and a charge transporting or photoconductive overcoat layer 9. However, additional optional layers can be provided, for their known uses. For example, an optional adhesive layer may be applied to the electrically conductive surface prior to the application of the charge transport layer.

The particular construction of an exemplary imaging member will now be described in more detail. However, the following discussion is of only one embodiment, and is not limiting of the disclosure.

The substrate may be opaque or substantially transparent and may comprise numerous suitable materials having the required mechanical properties. Accordingly, the substrate may comprise a layer of an electrically non-conductive or conductive material such as an inorganic or an organic composition. As electrically non-conducting materials there may be employed various resins known for this purpose including, but not limited to, polyesters, polycarbonates, polyamides, polyurethanes, mixtures thereof, and the like. As electrically conductive materials there may be employed thin films of metals or metallic alloys, various resins that incorporate conductive particles, including, but not limited to, resins containing an effective amount of carbon black, or metals such as copper, aluminum, nickel, and the like. The substrate can be of either a single layer design, homogeneously or heterogeneously mixed layer or a multi-layer design including, for example, an electrically insulating layer having an electrically conductive layer applied thereon.

The electrically insulating or conductive substrate is preferably in the form of a rigid cylinder, drum or a flexible belt. In the case of the substrate being in the form of a belt, the belt can be seamed or seamless, with a seamless belt being particularly preferred.

The thickness of the substrate layer depends on numerous factors, including strength and rigidity desired and economical considerations. Thus, this layer may be of substantial thickness, for example, about 5000 micrometers or more, or of minimum thickness of less than or equal to about 150 micrometers, or anywhere in between, provided there are no adverse effects on the final electrostatographic device. The surface of the substrate layer is preferably cleaned prior to coating to promote greater adhesion of the deposited coating. Cleaning may be effected by any known process including, for example, by exposing the surface of the substrate layer to plasma discharge, ion bombardment, sand blasting and/or the like.

The conductive layer may vary in thickness over substantially wide ranges depending on the optical transparency and degree of flexibility desired for the electrostatographic member. Accordingly, for a photoresponsive imaging device having an electrically insulating, transparent plastic film, the thickness of the conductive layer may be between about 10 Angstrom units to about 500 Angstrom units, and more preferably from about 100 Angstrom units to about 200 Angstrom units for an optimum combination of electrical conductivity and light transmission. The conductive layer may be an electrically conductive metal layer formed, for example, on the substrate by any suitable coating technique, such as a vacuum depositing technique or dispersion coating. Typical metals include, but are not limited to, aluminum, zirconium, niobium, tantalum, vanadium and hafnium, titanium, nickel, stainless steel, chromium, tungsten, molybdenum, mixtures thereof, and the like. In general, a continuous metal film can be attained on a suitable substrate, e.g. a polyester film substrate such as Mylar available from E.I. du Pont de Nemours & Co., with magnetron sputtering.

If desired, an alloy of suitable metals may be deposited. Typical metal alloys may contain two or more metals such as zirconium, niobium, tantalum, vanadium and hafnium, titanium, nickel, stainless steel, chromium, tungsten, molybdenum, and the like, and mixtures thereof. Regardless of the technique employed to form the metal layer, a thin layer of metal oxide generally forms on the outer surface of most metals upon exposure to air. Thus, when other layers overlying the metal layer are characterized as "contiguous" (or adjacent or adjoining) layers, it is intended that these overlying contiguous layers may, in fact, contact a thin metal oxide layer that has formed on the outer surface of the oxidizable metal layer. Generally, for rear erase exposure, a conductive layer light transparency of at least about 15 percent is desirable. The conductive layer need not be limited to metals. Other examples of conductive layers may be combinations of materials such as conductive indium tin oxide as a transparent layer for light having a wavelength between about 4000 Angstroms and about 7000 Angstroms or a conductive carbon black dispersed in a plastic binder as an opaque conductive layer. A typical electrical conductivity for conductive layers for electrophotographic imaging members in slow speed copiers and printers is about $10^2$ to $10^3$ ohms/square.

An optional inert layer may be applied to promote adhesion of next layer to the underlying substrate, a so called adhesive layer. Any suitable adhesive layer well known in the art may be utilized. Typical adhesive layer materials include, for example, but are not limited to, polyesters, dupont 49,000 (available from E.I. dupont de Nemours and Company), Vitel PE100 (available from Goodyear Tire & Rubber), polyurethanes, and the like. Satisfactory results may be achieved with adhesive layer thickness between about 0.05 micrometer (500 Angstrom) and about 0.3 micrometer (3,000 Angstroms). Conventional techniques for applying an adhesive layer coating mixture to the charge blocking layer include spraying, dip coating, roll coating, wire wound rod coating, gravure coating, Bird applicator coating, and the like. Drying of the deposited coating may be effected by any suitable conventional technique such as oven drying, infra red radiation drying, air drying and the like.

The electrophotographic imaging member of the present disclosure generally contains a hole transport layer applied to the adhesive layer, or optionally directly to the metalized substrate if no adhesive layer is present. The hole transport layer generally comprises any suitable organic polymer or non-polymeric material capable of transporting charge. Hole (or charge) transporting layers may be formed by any conventional materials and methods, such as the materials and methods disclosed in U.S. Pat. No. 5,521,047 to Yuh et al., the entire disclosure of which is incorporated herein by reference. In addition, the hole transporting layers may be formed as an aromatic diamine dissolved or molecularly dispersed in an electrically inactive polystyrene film forming binder, such as disclosed in U.S. Pat. No. 5,709,974, the entire disclosure of which is incorporated herein by reference.

The hole transport layer of the disclosure generally includes at least a binder and at least one arylamine hole transport (or electron donor) material. The binder should be soluble in a solvent or solvent mixture, which also solubilizes the arylamine selected for use with the composition such as, for example, methylene chloride, chlorobenzene, tetrahydrofuran, toluene or another suitable solvent. Suitable binders may include, for example, polycarbonates, polyesters, polyarylates, polyacrylates, polyethers, polysulfones and mixtures thereof. Preferred binder materials are polycarbonates. Although any polycarbonate binder may be used, preferably the polycarbonate is either a bisphenol Z polycarbonate or a biphenyl A polycarbonate. Example biphenyl A polycarbonates are the MAKROLON® polycarbonates. Example bisphenol Z polycarbonates are the LUPILON® polycarbonates, also widely identified in the art as PCZ polycarbonates, e.g., PCZ-800, PCZ-600, PCZ-500 and PCZ-400 polycarbonate resins and mixtures thereof.

As the hole transport materials, at least one of the hole transport materials generally comprises an arylamine compound. Arylamine hole transport materials can be subdivided into monoamines, diamines, triamines, etc. Examples of aryl monoamines include, but not limited to: N,N-bis(4-methylphenyl)-4-biphenylylamine, N,N-bis(4-methoxyphenyl)-4-biphenylylamine, N,N-bis-(3-methylphenyl)-4-biphenylylamine, N,N-bis(3-methoxyphenyl)-4-biphenylylamine, N,N,N-tri[3-methylphenyl]amine, N,N,N-tri[4-methylphenyl]amine, N,N-di(3-methylphenyl)-p-toluidine, N,N-di(4-methylphenyl)-m-toluidine, and N,N-bis-(3,4-dimethylphenyl)-4-biphenylamine (DBA), and mixtures thereof. Examples of aryl diamines include: those described in U.S. Pat. Nos. 4,306,008, 4,304,829, 4,233,384, 4,115,116, 4,299,897, 4,265,990, 4,081,274 and 6,214,514, each incorporated herein by reference. Typical aryl diamine transport compounds include N,N'-diphenyl-N,N'-bis(alkylphenyl)-[1,1'-biphenyl]-4,4'-diamine wherein the alkyl is linear such as for example, methyl, ethyl, propyl, n-butyl and the like, N,N'-diphenyl-N,N'-bis(3-methylphenyl)-[1,1'-biphenyl]-4,4'-diamine, N,N'-diphenyl-N,N'-bis(4-methylphenyl)-[1,1'-biphenyl]-4,4'-diamine, N,N'-diphenyl-N,N'-bis(2-methylphenyl)-[1,1'-biphenyl]-4,4'-diamine, N,N'-diphenyl-N,N'-bis(3-ethylphenyl)-[1,1'-biphenyl]-4,4'-diamine, N,N'-diphenyl-N,N'-bis(4-ethylphenyl) -[1,1'-biphenyl]-4,4'-diamine, N,N'-diphenyl-N,N'-bis(4-n-butylphenyl)-[1,1'-biphenyl]4,4'-diamine, N,N'-diphenyl-N,N'-bis(phenylmethyl)-[1,1'-biphenyl]-4,4'-diamine, N,N,N',N'-tetraphenyl-[2,2'-dimethyl-1,1'-biphenyl]-4,4'-diamine, N,N,N',N'-tetra(4-methylphenyl)-[2,2'-dimethyl-1,1'-biphenyl]-4,4'-diamine, N,N'-diphenyl-N,N'-bis(4-methylphenyl)-[2,2'-dimethyl-1,1'-biphenyl]-4,4'-diamine, N,N'-diphenyl-N,N'-bis(2-methylphenyl)-[2,2'-dimethyl-1,1'-biphenyl]-4,4'-diamine, N,N'-diphenyl-N,N'-bis(3-methylphenyl)-[2,2'-dimethyl-1,1'-biphenyl]-4,4'-diamine, N,N'-diphenyl-N,N'-bis(3-methylphenyl)-pyrenyl-1,6-diamine, mixtures thereof and the like.

Typically, the hole transport material is present in the hole transport layer in an amount of from about 5 to about 80 percent by weight, such as from about 25 to about 75 percent by weight, and the binder is present in an amount of from about 20 to about 95 percent by weight, such as from about 25 to about 75 percent by weight, although the relative amounts can be outside these ranges.

Any suitable and conventional technique may be utilized to mix and thereafter apply the hole transport layer coating mixture to the underlying layer. Typical application techniques include spraying, dip coating, roll coating, wire wound rod coating, and the like. Preferably, the coating mixture of the hole transport layer comprises between about 9 percent and about 12 percent by weight binder, between about 27 percent and about 3 percent by weight hole transport material, between about 64 percent and about 85 percent by weight solvent for dip coating applications. Drying of the deposited coating may be effected by any suitable conventional technique such as oven drying, infra-red radiation drying, air drying and the like.

Generally, the thickness of the hole transport layer is between about 10 and about 50 micrometers, such as from about 20 to about 40 micrometers, but thicknesses outside this range can also be used. The hole transport layer should preferably be an insulator to the extent that the electrostatic charge placed on the charge transport layer is not conducted in the absence of illumination at a rate sufficient to prevent formation and retention of an electrostatic latent image thereon. In general, the ratio of thickness of the hole transport layer to the charge generator layer is preferably maintained from about 2:1 to about 200:1 and in some instances as great as about 400:1. In other words, the hole transport layer is substantially non-absorbing to visible light or radiation in the region of intended use but is "active" in that it allows the injection of photogenerated holes from the photoconductive layer, i.e., charge generation layer, and allows these holes to be transported through the active charge transport layer to selectively discharge a surface charge on the surface of the active layer.

Any suitable photogenerating layer may be applied to the hole transport layer, which in turn can then be overcoated with a suitable charge transporting or photoconductive overcoating layer as described hereinafter. Examples of typical photogenerating layers include, but are not limited to, inorganic photoconductive particles such as amorphous selenium, trigonal selenium, and selenium alloys selected from the group consisting of selenium-tellurium, selenium-tellurium-arsenic, selenium arsenide and mixtures thereof, and organic photoconductive materials including various phthalocyanine based pigments such as the X-form of metal free phthalocyanine described in U.S. Pat. No. 3,357,989, metal oxide phthalocyanines such as but not limited to vanadyl phthalocyanine and titanyl phthalocyanine, metal phthalocyanines such as but not limited to copper phthalocyanine and cobalt phthalocyanine, and substituted phthalocyanines such as but not limited to hydroxygallium phthalocyanine, chlorogallium phthalocyanine and chloroindium phthalocyanine and other known photogenerating pigments materials such as but not limited to, dibromoanthanthrone, squarylium, quinacridones available from Dupont under the tradename Monastral Red, Monastral violet and Monastral Red Y, Vat orange 1 and Vat orange 3 trade names for dibromoanthanthrone pigments, benzimidazole perylene, perylene pigments as disclosed in U.S. Pat. No. 5,891,594, the entire disclosure of which is incorporated herein by reference, substituted 2,4-diamino-triazines disclosed in U.S. Pat. No. 3,442,781, polynuclear aromatic quinones available from Allied Chemical Corporation under the tradename Indofast Double Scarlet, Indofast Violet Lake B, Indofast Brilliant Scarlet and Indofast Orange, and the like dispersed in a film forming polymeric binder. Multi-photogenerating layer compositions may be utilized where a photoconductive layer enhances or reduces the properties of the photogenerating layer. Examples of this type of configuration are described in U.S. Pat. No. 4,415,639, the entire disclosure of which is incorporated herein by reference. Other suitable photogenerating materials known in the art may also be utilized, if desired.

Charge generating binder layers comprising particles or layers comprising a photoconductive material such as vanadyl phthalocyanine, metal free phthalocyanine, hydroxygallium phthalocyanine, titanyl phthalocyanine, benzimidazole perylene, amorphous selenium, trigonal selenium, selenium alloys such as selenium-tellurium, selenium-tellurium-arsenic, selenium arsenide, and the like and mixtures thereof are especially preferred because of their sensitivity to white light. Vanadyl phthalocyanine, metal free phthalocyanine, hydroxygallium phthalocyanine, titanyl phthalocyanine, and selenium tellurium alloys are also preferred because these materials provide the additional benefit of being sensitive to infra-red light.

Any suitable polymeric film forming binder material may be employed as the matrix in the photogenerating binder layer. Typical polymeric film forming materials include, but are not limited to, those described, for example, in U.S. Pat. No. 3,121,006, the entire disclosure of which is incorporated herein by reference. Thus, typical organic polymeric film forming binders include, but are not limited to, thermoplastic and thermosetting resins such as polycarbonates, polyesters, polyamides, polyurethanes, polystyrenes, polyarylethers, polyarylsulfones, polybutadienes, polysulfones, polyethersulfones, polyethylenes, polypropylenes, polyimides, polymethylpentenes, polyphenylene sulfides, polyvinyl acetate, polysiloxanes, polyacrylates, polyvinyl acetals, polyamides, polyimides, amino resins, phenylene oxide resins, terephthalic acid resins, phenoxy resins, epoxy resins, phenolic resins, polystyrene and acrylonitrile copolymers, polyvinylchloride, vinylchloride and vinyl acetate copolymers, acrylate copolymers, alkyd resins, cellulosic film formers, poly (amideimide), styrene-butadiene copolymers, vinylidenechloride-vinylchloride copolymers, vinylacetate-vinylidenechloride copolymers, styrene-alkyd resins, polyvinylcarbazole, mixtures thereof, and the like. These polymers may be block, random or alternating copolymers.

The photogenerating composition or pigment may be present in the resinous binder composition in various amounts. Generally, however, the photogenerating composition or pigment may be present in the resinous binder in an amount of from about 5 percent by volume to about 90 percent by volume of the photogenerating pigment dispersed in about 10 percent by volume to about 95 percent by volume of the resinous binder, such as from about 20 percent by volume to about 30 percent by volume of the photogenerating pigment is dispersed in about 70 percent by volume to about 80 percent by volume of the resinous binder composition. In one embodiment, about 8 percent by volume of the photogenerating pigment is dispersed in about 92 percent by volume of the resinous binder composition.

The photogenerating layer containing photoconductive compositions and/or pigments and the resinous binder material generally ranges in thickness of from about 0.1 micrometer to about 5.0 micrometers, and preferably has a thickness of from about 0.3 micrometer to about 3 micrometers. The photogenerating layer thickness is generally related to binder content. Thus, for example, higher binder content compositions generally require thicker layers for photogeneration. Thickness outside these ranges can be selected providing the objectives of the present disclosure are achieved.

Any suitable and conventional technique may be utilized to mix and thereafter apply the photogenerating layer coating mixture. Typical application techniques include spraying, dip coating, roll coating, wire wound rod coating, and the like. Drying of the deposited coating may be effected by any suitable conventional technique such as oven drying, infrared radiation drying, air-drying and the like.

A suitable charge transporting or photoconductive overcoating layer is applied over the charge generating layer. The overcoat layer may comprise, for example, any suitable material that makes the overcoating layer robust and resistant to wear, and allows easy dissipation of charge (accumulated holes) from the surface of the overcoating layer. This is accomplished in embodiments by either having the overcoating layer electron conducting so that electrons traveling through the other layers of the device are able to neutralize positive surface charge, or by making the overcoating layer photoconductive to a different (such as shorter) or the same wavelength as the exposure wavelength so that said exposure generates hole and electron pairs thereby allowing for neutralization of both surface charges and charges traveling through the device.

In one embodiment, the overcoating layer is a photoconductive overcoat, preferably an abrasion resistant photoconductive overcoat. This overcoating layer can be formed, for example, of hard inorganic photoconductive particles in a polymer binder. Optionally, the photoconductive overcoat can include hole transport molecules, although they are not required in embodiments, and can be omitted in some embodiments as not necessary.

The photoconductive particles for use in this embodiment can be suitably selected from any known photoconductive particles, including those described above for the charge generating layer materials. For example, suitable photoconductive particles can be selected from, but are not limited to, inorganic compounds such as silicon carbide, cadmium sulfoselenide, cadmium selenide, cadmium sulfide, mixtures thereof, and the like; inorganic photoconductive glasses, such as amorphous selenium, selenium alloys such as selenium-tellurium, selenium-tellurium-arsenic and selenium-arsenic, mixtures thereof, and the like. Selenium may also be used in a crystalline form known as trigonal selenium.

The photoconductive particles can be dispersed in any suitable binder, such as a polymeric binder, and preferably an inert binder. Any of the above-described binder materials can be used. For example, typical organic polymeric film forming binders include, but are not limited to, thermoplastic and thermosetting resins such as polycarbonates, polyesters, polyamides, polyurethanes, polystyrenes, polyarylethers, polyarylsulfones, polybutadienes, polysulfones, polyethersulfones, polyethylenes, polypropylenes, polyimides, polymethylpentenes, polyphenylene sulfides, polyvinyl acetate, polysiloxanes, polyacrylates, polyvinyl acetals, polyamides, polyimides, amino resins, phenylene oxide resins, terephthalic acid resins, phenoxy resins, epoxy resins, phenolic resins, polystyrene and acrylonitrile copolymers, polyvinylchloride, vinylchloride and vinyl acetate copolymers, acrylate copolymers, alkyd resins, cellulosic film formers, poly (amideimide), styrene-butadiene copolymers, vinylidenechloride-vinylchloride copolymers, vinylacetate-vinylidenechloride copolymers, styrene-alkyd resins, polyvinylcarbazole, mixtures thereof, and the like. These polymers may be block, random or alternating copolymers.

According to this embodiment, the photoconductive overcoat layer essentially acts as a dielectric layer during the development exposure step, if it is not sensitive to exposure light wavelength. If the overcoating layer contained only insulating materials or particles, it would result in an accumulation of charge on the surface of the imaging member, which would cause dielectric breakdown. However, with incorporation of the photoconductive particles, the accumulated charge is dissipated during the erase cycle when the erase light source emits wavelengths to which the photoconductive particles are sensitive.

In another embodiment, the overcoating layer is formed as an electron transport layer, preferably an abrasion resistant electron transport layer. This overcoating layer can be formed, for example, of electron transporting materials dispersed in a polymer binder.

The electron transporting materials for use in this embodiment can be suitably selected from any known of after-developed electron transporting materials. For example, suitable electron transporting materials can be selected from, but are not limited to, organic pigments and dyes such as a phthalocyanine compounds, squarium compounds, anthoanthrone compounds, perylene compounds, azo compounds, anthraquinone compounds, pyrene compounds, pyrylium compounds, thiapyrylium compounds, mixtures thereof, and the like. For example, a suitable thiapyrylium compound includes thiapyrylium dye. Other suitable electron transporting materials can be selected from, but are not limited to, a carboxlfluorenone malonitrile of the formula:

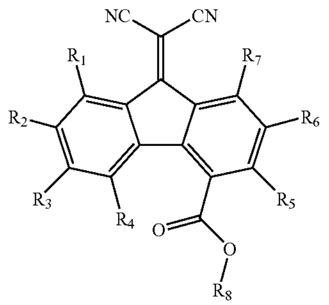

wherein each R is independently selected from the group consisting of hydrogen, alkyl, alkoxy, aryl, halide, halide, and substituted aryl; a nitrated fluoreneone of the formula:

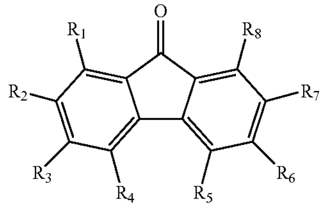

wherein each R is independently selected from the group consisting of alkyl, alkoxy, aryl, substituted aryl, and halide and wherein at least 2 R groups are nitro; a diimide selected from the group consisting of N,N'bis(dialkyl)-1,4,5,8-naphthalenetetracarboxylic diimide and N,N'bis(diaryl)-1,4,5,8-naphthalenetetracarboxylic diimide represented by the formula:

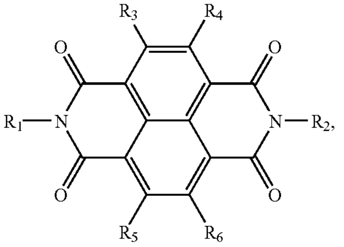

wherein R1 is alkyl, alkoxy, cycloalkyl, halide, or aryl; R2 is alkyl, cycloalkyl, or aryl; a 1,1'-dioxo-2-(aryl)-6-phenyl-4-(dicyanomethylidene)thiopyran of the formula:

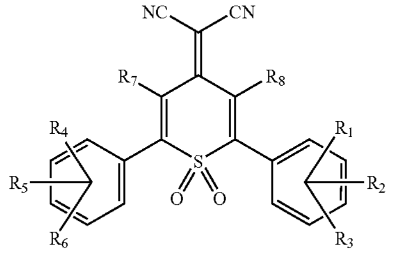

wherein each R is independently selected from the group consisting of wherein each R is independently selected from the group consisting of hydrogen, alkyl, alkoxy, aryl, and substituted aryl and halide; a carboxybenzylnaphthaquinone of the alternative formulas:

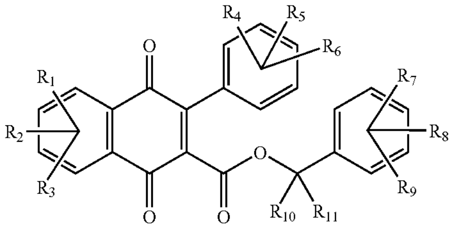

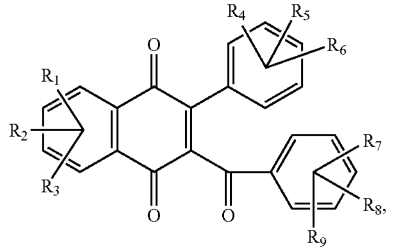

wherein each R is independently selected from the group consisting of hydrogen, alkyl, alkoxy, aryl, substituted aryl and halide; a diphenoquinone of the formula:

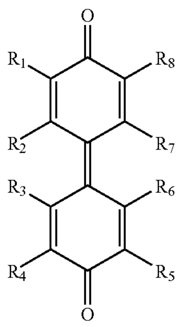

wherein each R is independently selected from the group consisting of hydrogen, alkyl, alkoxy, aryl, substituted aryl and halide; and mixtures thereof.

The electron transporting material can be dispersed in any suitable binder, such as a polymeric binder, and preferably an inert binder. Suitable binders include those mentioned for the photoconductive overcoat layer, described above. The combination of binder and the electron transporting material is selected to be abrasion resistant, or chemically inert, resistant to corona effluent or mechanically robust.

In another embodiment, the overcoating layer is a bipolar transporting layer, preferably an abrasion resistant bipolar transporting layer. This overcoating layer can be formed, for example, of electron transporting materials and hole transporting materials dispersed in any suitable binder, such as a polymeric binder, and preferably an inert binder. Any of the above-described binder materials can be used. For example, typical organic polymeric film forming binders include, but are not limited to, thermoplastic and thermosetting resins such as polycarbonates, polyesters, polyamides, polyurethanes, polystyrenes, polyarylethers, polyarylsulfones, polybutadienes, polysulfones, polyethersulfones, polyethylenes, polypropylenes, polyimides, polymethylpentenes, polyphenylene sulfides, polyvinyl acetate, polysiloxanes, polyacrylates, polyvinyl acetals, polyamides, polyimides, amino resins, phenylene oxide resins, terephthalic acid resins, phenoxy resins, epoxy resins, phenolic resins, polystyrene and acrylonitrile copolymers, polyvinylchloride, vinylchloride and vinyl acetate copolymers, acrylate copolymers, alkyd resins, cellulosic film formers, poly(amideimide), styrene-butadiene copolymers, vinylidenechloride-vinylchloride copolymers, vinylacetate-vinylidenechloride copolymers, styrene-alkyd resins, polyvinylcarbazole, mixtures thereof, and the like. These polymers may be block, random or alternating copolymers.

In another embodiment, the bipolar layer is formed preferably as an abrasion resistant bipolar layer. This overcoating layer can be formed, for example, of electron transporting and hole transporting materials dispersed in a polymer binder. The hole transporting materials used in this embodiment can be suitably selected from any known of after-developed hole transporting materials. For example at least one of the hole transport materials generally comprises an arylamine compound. Arylamine hole transport materials can be subdivided into monoamines, diamines, triamines, etc. Examples of aryl monoamines include but not limited to: N,N-bis(4-methylphenyl)-4-biphenylylamine, N,N-bis(4-methoxyphenyl)-4-biphenylylamine, N,N-bis-(3-methylphenyl)-4-biphenylylamine, N,N-bis(3-methoxyphenyl)-4-biphenylylamine, N,N,N-tri[3-methylphenyl]amine, N,N,N-tri[4-methylphenyl]amine, N,N-di(3-methylphenyl)-p-toluidine, N,N-di(4-methylphenyl)-m-toluidine, and N,N-bis-(3,4-dimethylphenyl)-4-biphenylamine (DBA), and mixtures thereof. Examples of aryl diamines include: those described in U.S. Pat. Nos. 4,306,008, 4,304,829, 4,233,384, 4,115,116, 4,299,897, 4,265,990, 4,081,274 and 6,214,514, each incorporated herein by reference. Typical aryl diamine transport compounds include N,N'-diphenyl-N,N'-bis(alkylphenyl)-[1,1'-biphenyl]-4,4'-diamine wherein the alkyl is linear such as for example, methyl, ethyl, propyl, n-butyl and the like, N,N'-diphenyl-N,N'-bis(3-methylphenyl)-[1,1'-biphenyl]-4,4'-diamine, N,N'-diphenyl-N,N'-bis(4-methylphenyl) -[1,1'-biphenyl]-4,4'-diamine, N,N'-diphenyl-N,N'-bis(2-methylphenyl)-[1,1'-biphenyl]-4,4'-diamine, N,N'-diphenyl-N,N'-bis(3-ethylphenyl)-[1,1'-biphenyl]-4,4'-diamine, N,N'-diphenyl-N,N'-bis(4-ethylphenyl)-[1,1'-biphenyl]-4,4'-diamine, N,N'-diphenyl-N,N'-bis(4-n-butylphenyl)-[1,1'-biphenyl]-4,4'-diamine, N,N'-diphenyl-N,N'-bis (phenylmethyl)- [1,1'-biphenyl]-4,4'-diamine, N,N,N,',N'-tetraphenyl-[2,2'-dimethyl-1,1'-biphenyl]-4,4'-diamine, N,N,N',N'-tetra(4-methylphenyl)-[2,2'-dimethyl-1,1'-biphenyl]-4,4'-diamine, N,N'-diphenyl-N,N'-bis(4-methylphenyl)-[2,2'-dimethyl-1,1'-biphenyl]-4,4'-diamine, N,N'-diphenyl-N,N'-bis(2-methylphenyl)-[2,2'-dimethyl-1,1'-biphenyl]-4,4'-diamine, N,N'-diphenyl-N,N'-bis(3-methylphenyl)-[2,2'-dimethyl-1,1'-biphenyl]-4,4'-diamine, N,N'-diphenyl-N,N'-bis(3-methylphenyl)-pyrenyl-1,6-diamine, mixtures thereof and the like.

The electron transporting materials for use in this embodiment can be suitably selected from any known of after-developed electron transporting materials. For example, said electron transporting material is selected from the group consisting of, but not limited to, a carboxlfluorenone malonitrile of the formula:

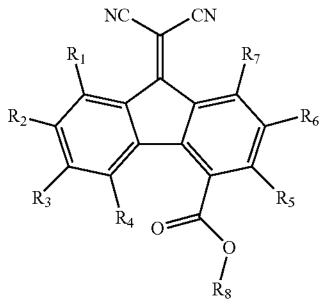

wherein each R is independently selected from the group consisting of hydrogen, alkyl, alkoxy, aryl, halide, halide, and substituted aryl; a nitrated fluoreneone of the formula:

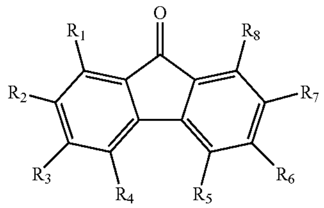

wherein each R is independently selected from the group consisting of alkyl, alkoxy, aryl, substituted aryl, and halide and wherein at least 2 R groups are nitro; a diimide selected from the group consisting of N,N'bis(dialkyl)-1,4,5,8-naphthalenetetracarboxylic diimide and N,N'bis(diaryl)-1,4,5,8-naphthalenetetracarboxylic diimide represented by the formula:

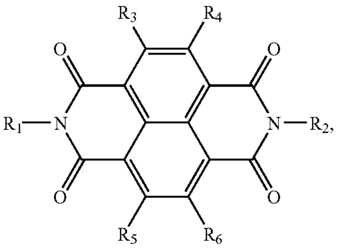

wherein R1 is alkyl, alkoxy, cycloalkyl, halide, or aryl; R2 is alkyl, cycloalkyl, or aryl; a 1,1'-dioxo-2-(aryl)-6-phenyl-4-(dicyanomethylidene)thiopyran of the formula:

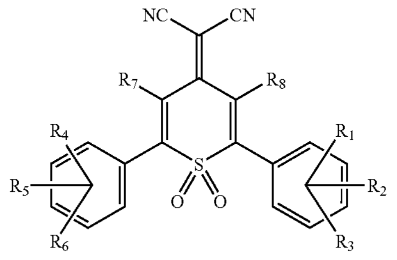

wherein each R is independently selected from the group consisting of wherein each R is independently selected from the group consisting of hydrogen, alkyl, alkoxy, aryl, and substituted aryl and halide; a carboxybenzylnaphthaquinone of the alternative formulas:

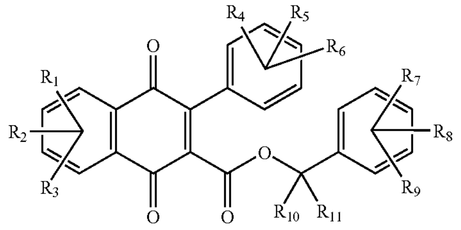

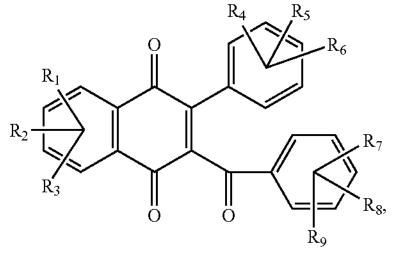

wherein each R is independently selected from the group consisting of hydrogen, alkyl, alkoxy, aryl, substituted aryl and halide; a diphenoquinone of the formula:

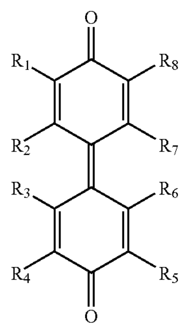

and mixtures thereof, wherein each R is independently selected from the group consisting of hydrogen, alkyl, alkoxy, aryl, substituted aryl and halide.

The electron transporting material can be dispersed in any suitable binder, such as a polymeric binder, and preferably an inert binder. Suitable binders include those mentioned for the photoconductive overcoat layer, described above. The combination of binder and the electron transporting material is selected to be abrasion resistant, or chemically inert, resistant to corona effluent or mechanically robust.

In another embodiment, the overcoating layer is a bipolar transporting layer, preferably an abrasion resistant bipolar transporting layer. This overcoating layer can be formed, for example, of electron transporting materials and hole transporting materials dispersed in a silicon binder material. Optionally either or both of the electron transporting materials and hole transporting materials can be chemical modified or contain chemical modification to enable them to react directly with the silicon binder material or other electrically inert silicon materials to make up a crosslinked siloxane composition.

Silicon binder overcoat layers are generally known, and have been disclosed as incorporating charge transport molecules therein. For example, an overcoating layer comprising a crosslinked siloxane composition, which is the product of hydrolysis and condensation of at least one silicon-containing compound, is disclosed in U.S. patent application Ser. No. 11/034,062, the entire disclosure of which is incorporated herein by reference. The crosslinked siloxane also includes an arylamine hole transport molecule. Related disclosures are also included in U.S. patent application Ser. Nos. 11/034,713, 11/034,062, 10/998,585, 10/992,690, 10/992,687, 10/992,658, and 10/938,887, the entire disclosures of which are incorporated herein by reference.

These silicon binder overcoat layers can be further modified, however, to be made bipolar by the incorporation of electron transport materials therein. For example, suitable electron transport materials include, but are not limited to, N,N'-bis(1,2-dimethylpropyl)-1,4,5,8-naphthalenetetracarboxylic diimide represented by the following formula

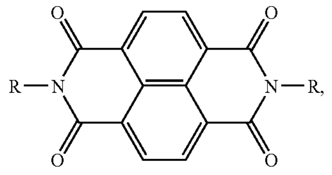

1,1'-dioxo-2-(4-methylphenyl)-6-phenyl-4-(dicyanomethylidene)thiopyran represented by the following formula

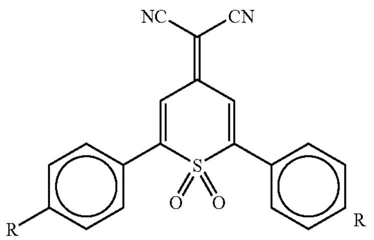

wherein R and R are independently selected from the group consisting of hydrogen, alkyl with, for example, 1 to about 4 carbon atoms, alkoxy with, for example, 1 to about 4 carbon atoms, and halogen; a quinone selected, for example, from the group consisting of carboxybenzylnaphthaquinone represented by the following formula

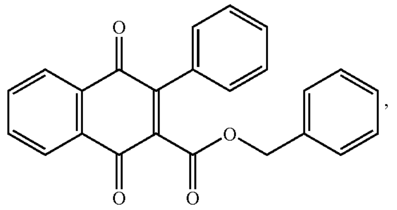

tetra(t-butyl) diphenolquinone represented by the following formula

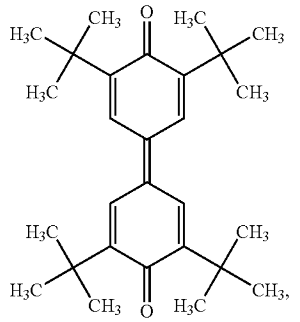

mixtures thereof, and the like; the butoxy derivative of carboxyfluorenone malononitrile; the 2-ethylhexanol of carboxyfluorenone malononitrile; the 2-heptyl derivative of N,N'-bis(1,2-diethylpropyl)-1,4,5,8-naphthalenetetracarboxylic diimide; and the sec-isobutyl and n-butyl derivatives of 1,1-(N,N'-bisalkyl-bis-4-phthalimido)-2,2-biscyano-ethylene.

Specific, and in embodiments preferred, electron transport components are those that are soluble in the solvent matrix illustrated herein, and which components are, for example, carboxyfluorenone malononitrile (CFM) derivatives represented by

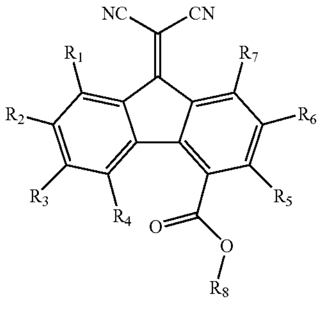

wherein each R is independently selected from the group consisting of hydrogen, alkyl having 1 to about 40 carbon atoms (for example, throughout with respect to the number of carbon atoms), alkoxy having 1 to about 40 carbon atoms, phenyl, substituted phenyl, higher aromatic such as naphthalene and anthracene, alkylphenyl having 6 to about 40 carbons, alkoxyphenyl having 6 to 40 carbons, aryl having 6 to 30 carbons, substituted aryl having 6 to about 30 carbons and halogen; or a nitrated fluorenone derivative represented by

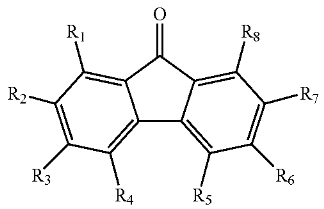

wherein each R is independently selected from the group consisting of hydrogen, alkyl, alkoxy, aryl, such as phenyl, substituted phenyl, higher aromatics such as naphthalene and anthracene, alkylphenyl, alkoxyphenyl, carbons, substituted aryl and halogen, and wherein at least 2 R groups are nitro; a N,N'-bis(dialkyl)-1,4,5,8-naphthalenetetracarboxylic diimide derivative or N,N'-bis(diaryl)-1,4,5,8-naphthalenetetracarboxylic diimide derivative represented by the general formula/structure

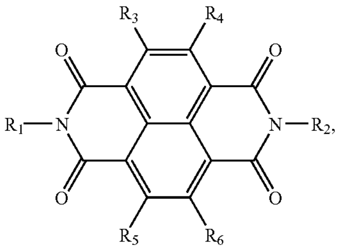

wherein $R_1$ is, for example, substituted or unsubstituted alkyl, branched alkyl, cycloalkyl, alkoxy or aryl, such as phenyl, naphthyl, or a higher polycyclic aromatic, such as anthracene; $R_2$ is alkyl, branched alkyl, cycloalkyl, or aryl, such as phenyl, naphthyl, or a higher polycyclic aromatics, such as anthracene, or wherein $R_2$ is the same as $R_1$; $R_1$ and $R_2$ can independently possess from 1 to about 50 carbons, and more specifically, from 1 and about 12 carbons. $R_3$, R4, $R_5$ and R6 are alkyl, branched alkyl, cycloalkyl, alkoxy or aryl, such as phenyl, naphthyl, or a higher polycyclic aromatics such as anthracene or halogen and the like. $R_3$, $R_4$, $R_5$ and $R_6$ can be the same or different; a 1,1'-dioxo-2-(aryl)-6-phenyl-4-(dicyanomethylidene)thiopyran

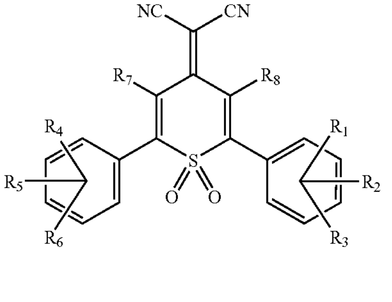

wherein each R is, for example, independently selected from the group consisting of hydrogen, alkyl with 1 to about 40 carbon atoms, alkoxy with 1 to about 40 carbon atoms, phenyl, substituted phenyl, higher aromatics such as naphthalene and anthracene, alkylphenyl with 6 to about 40 carbons, alkoxyphenyl with 6 to about 40 carbons, aryl with 6 to about 30 carbons, substituted aryl with 6 to about 30 carbons and halogen; a carboxybenzyl naphthaquinone represented by the following

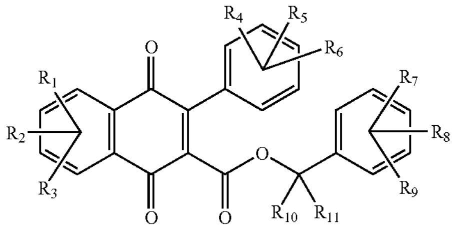

and/or

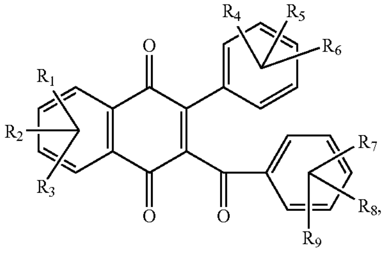

wherein each R is independently selected from the group consisting of hydrogen, alkyl with 1 to about 40 carbon atoms, alkoxy with 1 to about 40 carbon atoms, phenyl, substituted phenyl, higher aromatics such as naphthalene and anthracene, alkylphenyl with 6 to about 40 carbons, alkoxyphenyl with 6 to about 40 carbons, aryl with 6 to about 30 carbons, substituted aryl with 6 to about 30 carbons and halogen; a diphenoquinone represented by the following

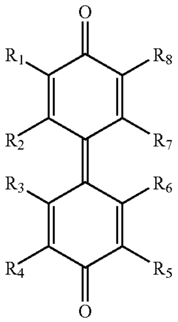

and mixtures thereof, wherein each of the R substituents are as illustrated herein; or oligomeric and polymeric derivatives in which the above moieties represent part of the oligomer or polymer repeat units, and mixtures thereof wherein the mixtures can contain from 1 to about 99 weight percent of one electron transport component and from about 99 to about 1 weight percent of a second electron transport component, and which electron transports can be dispersed in a resin binder, and wherein the total thereof is about 100 percent.

The thickness of the continuous overcoat layer selected may depend upon the abrasiveness of the charging (e.g., bias charging roll), cleaning (e.g., blade or web), development (e.g., brush), transfer (e.g., bias transfer roll), etc., system employed and can range up to about 10 micrometers. A thickness of between about 1 micrometer and about 5 micrometers in thickness is preferred. Any suitable and conventional technique may be utilized to mix and thereafter apply the overcoat layer coating mixture to the underlying layer. Typical application techniques include spraying, dip coating, roll coating, wire wound rod coating, and the like. Drying of the deposited coating may be effected by any suitable conventional technique such as oven drying, infrared radiation drying, air drying and the like.

Other layers may also be used, such as a conventional electrically conductive ground strip along one edge of the belt or drum in contact with the conductive layer, to facilitate connection of the electrically conductive layer of the photoreceptor to ground or to an electrical bias. Ground strips are well known and usually comprise conductive particles dispersed in a film forming binder.

In some cases, an anti-curl back coating may be applied to the side opposite the photoreceptor to provide flatness and/or abrasion resistance. These overcoating and anti-curl back coating layers are well known in the art and may comprise thermoplastic organic polymers or inorganic polymers that are electrically insulating or slightly semiconductive. Overcoatings are continuous and generally have a thickness of less than about 10 micrometers.

Any suitable conventional electrophotographic charging, exposure, development, transfer, fixing and cleaning techniques may be utilized to form and develop electrostatic latent images on the imaging member of this disclosure. Thus, for example, conventional light lens or laser exposure systems may be used to form the electrostatic latent image. The resulting electrostatic latent image may be developed by suitable conventional development techniques such as magnetic brush, cascade, powder cloud, and the like. However, in embodiments, the imaging members of this disclosure are positive charging imaging members; thus, the charging, exposure, development, transfer, fixing and cleaning techniques in these embodiments are desirably suited for use with such positive charging imaging members.

While the disclosure has been described in conjunction with the specific embodiments described above, it is evident that many alternatives, modifications and variations are apparent to those skilled in the art. Accordingly, the preferred embodiments of the disclosure as set forth above are intended to be illustrative and not limiting. Various changes can be made without departing from the spirit and scope of the disclosure.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. An imaging member comprising, in order:

a substrate, a charge transport layer, a charge generator layer, and a photoconductive overcoating layer comprising inorganic photoconductive particles in a polymer binder, wherein the inorganic photoconductive particles are selected from the group consisting of silicon carbide, cadmium sulfoselenide, cadmium selenide, cadmium sulfide, amorphous selenium, selenium alloys, trigonal selenium, and mixtures thereof, and the polymer binder is selected from the group consisting of polycarbonates, polyesters, polyamides, polyurethanes, polystyrenes, polyarylethers, polyarylsulfones, polybutadienes, polysulfones, polyethersulfones, polyethylenes, polypropylenes, polyimides, polymethylpentenes, polyphenylene sulfides, polyvinyl acetate, polysiloxanes, polyacrylates, polyvinyl acetals, polyamides, polyimides, amino resins, phenylene oxide resins, terephthalic acid resins, phenoxy resins, epoxy resins, phenolic resins, polystyrene and acrylonitrile copolymers, polyvinylchloride, vinylchloride and vinyl acetate copolymers, acrylate copolymers, alkyd resins, cellulosic film formers, poly(amideimide), styrene-butadiene copolymers, vinylidenechloride-vinylchloride copolymers, vinylacetate-vinylidenechloride copolymers, styrene-alkyd resins, polyvinylcarbazole, and mixtures thereof.

2. The imaging member of claim 1, wherein said imaging member is a positive charging imaging member.

3. An imaging member comprising, in order:

a substrate, a charge transport layer, a charge generator layer, and an electron transport overcoat layer comprising an electron transporting material dispersed in a polymer binder, wherein said electron transporting material is selected from the group consisting of organic pigments, dyes, and mixtures thereof, and the polymer binder is selected from the group consisting of polycarbonates, polyesters, polyamides, polyurethanes, polystyrenes, polyarylethers, polyarylsulfones, polybutadienes, polysulfones, polyethersulfones, polyethylenes, polypropylenes, polyimides, polymethylpentenes, polyphenylene sulfides, polyvinyl acetate, polysiloxanes, polyacrylates, polyvinyl acetals, polyamides, polyimides, amino resins, phenylene oxide resins, terephthalic acid resins, phenoxy resins, epoxy resins, phenolic resins, polystyrene and acrylonitrile copolymers, polyvinylchloride, vinylchloride and vinyl acetate copolymers, acrylate copolymers, alkyd resins, cellulosic film formers, poly(amideimide), styrene-butadiene copolymers, vinylidenechloride-vinylchloridc copolymers, vinylacetate-vinylidenechioride copolymers, styrene-alkyd resins, polyvinylcarbazole, and mixtures thereof.

4. The imaging member of claim 3, wherein said electron transporting material is selected from the group consisting of phthalocyanine compounds, squarium compounds, anthoanthrone compounds, perylene compounds, azo compounds, anthraquinone compounds, pyrene compounds, pyrylium compounds, thiapyrylium compounds, a carboxlfluorenone malonitrile of the formula:

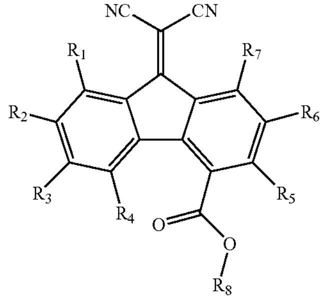

wherein each R is independently selected from the group consisting of hydrogen, alkyl, alkoxy, aryl, halide, halide, and substituted aryl; a nitrated fluoreneone of the formula:

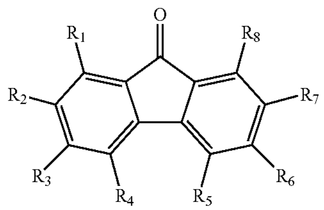

wherein each R is independently selected from the group consisting of alkyl, alkoxy, aryl, substituted aryl, and halide and wherein at least 2 R groups are nitro; a diimide selected from the group consisting of N,N'bis(dialkyl)-1,4,5,8-naphthalenetetracarboxylic diimide and N,N'bis(diaryl)-1,4,5,8-naphthalenetetracarboxylic diimide represented by the formula:

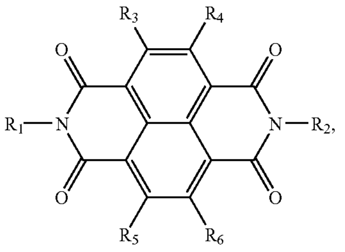

wherein R1 is alkyl, alkoxy, cycloalkyl, halide, or aryl; R2 is alkyl, cycloalkyl, or aryl; a 1,1'-dioxo-2-(aryl)-6-phenyl-4-(dicyanomethylidene)thiopyran of the formula:

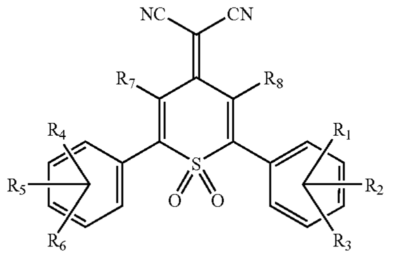

wherein each R is independently selected from the group consisting of wherein each R is independently selected from the group consisting of hydrogen, alkyl, alkoxy, aryl, and substituted aryl and halide; a carboxybenzylnaphthaquinone of the alternative formulas:

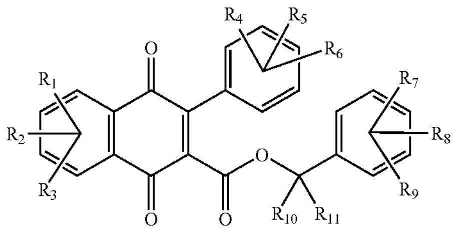

-continued

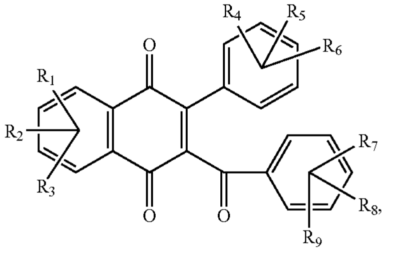

wherein each R is independently selected from the group consisting of hydrogen, alkyl, alkoxy, aryl, substituted aryl and halide; a diphenoquinone of the formula:

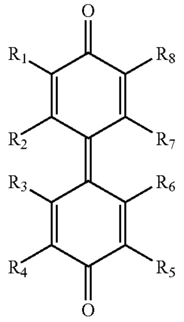

wherein each R is independently selected from the group consisting of hydrogen, alkyl, alkoxy, aryl, substituted aryl and halide; and mixtures thereof.

5. An imaging member comprising, in order:

a substrate, a charge transport layer, a charge generator layer, and a bipolar transporting overcoat layer comprising an electron transporting material dispersed in a silicon binder material.

6. The imaging member of claim 5, wherein said silicon binder material comprises a crosslinked siloxane composition, produced by hydrolysis and condensation of at least one silicon-containing compound, and said overcoating layer further comprises an arylamine hole transport molecule.

7. The imaging member of claim 5, wherein said electron transporting material is selected from the group consisting of a carboxlfluorenone malonitrile of the formula:

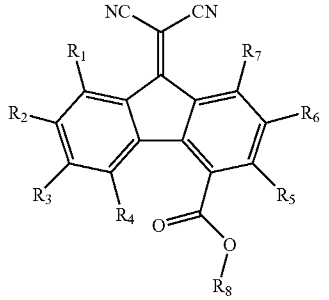

wherein each R is independently selected from the group consisting of hydrogen, alkyl, alkoxy, aryl, halide, halide, and substituted aryl; a nitrated fluoreneone of the formula:

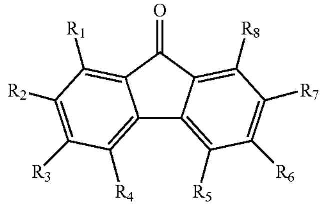

wherein each R is independently selected from the group consisting of alkyl, alkoxy, aryl, substituted aryl, and halide and wherein at least 2 R groups are nitro; a diimide selected from the group consisting of N,N'bis(dialkyl)-1,4,5,8-naphthalenetetracarboxylic diimide and N,N'bis(diaryl)-1,4,5,8-naphthalenetetracarboxylic diimide represented by the formula:

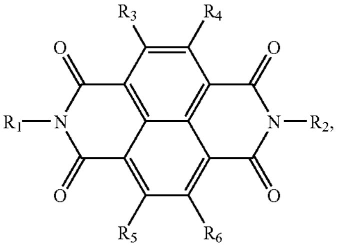

wherein R1 is alkyl, alkoxy, cycloalkyl, halide, or aryl; R2 is alkyl, cycloalkyl, or aryl; a 1,1'-dioxo-2-(aryl)-6-phenyl-4-(dicyanomethylidene)thiopyran of the formula:

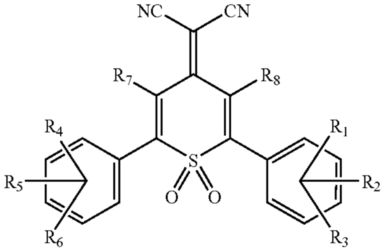

wherein each R is independently selected from the group consisting of wherein each R is independently selected from the group consisting of hydrogen, alkyl, alkoxy, aryl, and substituted aryl and halide; a carboxybenzylnaphthaquinone of the alternative formulas:

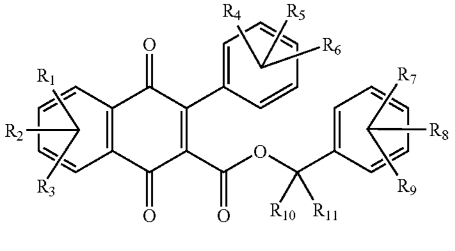

-continued

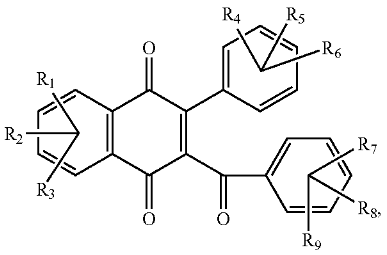

wherein each R is independently selected from the group consisting of hydrogen, alkyl, alkoxy, aryl, substituted aryl and halide; a diphenoquinone of the formula:

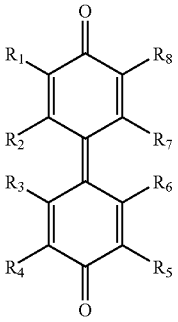

wherein each R is independently selected from the group consisting of hydrogen, alkyl, alkoxy, aryl, substituted aryl and halide; and mixtures thereof.

8. The imaging member of claim 1, wherein said photoconductive overcoating layer is photoconductive to a different wavelength than an exposure wavelength of said imaging member.

9. The imaging member of claim 1, wherein said photoconductive overcoating layer is photoconductive to a shorter wavelength than an exposure wavelength of said imaging member.

10. A process for forming the imaging member of claim 1, comprising:

providing the substrate, applying the charge transport layer over said substrate, applying the charge generator layer over the charge transport layer and applying the photoconductive overcoating layer over the charge generator layer.

11. The imaging member of claim 3, wherein said imaging member is a positive charging imaging member.

12. The imaging member of claim 3, wherein said electron transport overcoat layer is photoconductive to a different wavelength than an exposure wavelength of said imaging member.

13. The imaging member of claim 3, wherein said electron transport overcoat layer is photoconductive to a shorter wavelength than an exposure wavelength of said imaging member.

14. The imaging member of claim 5, wherein said imaging member is a positive charging imaging member.

15. The imaging member of claim 5, wherein said bipolar transporting overcoat layer is photoconductive to a different wavelength than an exposure wavelength of said imaging member.

16. The imaging member of claim 5, wherein said bipolar transporting overcoat layer is photoconductive to a shorter wavelength than an exposure wavelength of said imaging member.

17. A process for forming the imaging member of claim 3, comprising:

providing the substrate, applying the charge transport layer over said substrate, applying the charge generator layer over the charge transport layer and applying the electron transport overcoat layer over the charge generator layer.

18. A process for forming the imaging member of claim 5, comprising:

providing the substrate, applying the charge transport layer over said substrate, applying the charge generator layer over the charge transport layer and applying the bipolar transporting overcoat layer over the charge generator layer.

* * * * *